(12) United States Patent
Huang et al.

(10) Patent No.: US 6,908,530 B2
(45) Date of Patent: Jun. 21, 2005

(54) MICROWAVE PLASMA PROCESSING APPARATUS

(75) Inventors: Chih-Yung Huang, Hsinchu (TW); Ting-Wei Huang, Hsinchu (TW); Ching-Sung Hsiao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 186 days.

(21) Appl. No.: 10/331,479

(22) Filed: Dec. 31, 2002

(65) Prior Publication Data

US 2004/0069232 A1 Apr. 15, 2004

(51) Int. Cl.[7] .......................... C23C 16/00; H01L 21/00
(52) U.S. Cl. .......................... 156/345.41; 118/723 MW
(58) Field of Search ...................... 118/723 MW, 118/723 ME, 723 MR, 723 MA; 156/345.41, 345.42, 345.36; 315/111.21; 427/575; 438/710, 726

(56) References Cited

U.S. PATENT DOCUMENTS

| | | | | |
|---|---|---|---|---|
| 4,207,452 A | * | 6/1980 | Arai | 219/687 |
| 5,134,965 A | * | 8/1992 | Tokuda et al. | 118/723 MW |
| 5,580,420 A | * | 12/1996 | Watanabe et al. | 216/69 |
| 5,911,852 A | * | 6/1999 | Katayama et al. | 156/345.41 |
| 6,057,645 A | * | 5/2000 | Srivastava et al. | 315/111.21 |
| 6,066,568 A | * | 5/2000 | Kawai et al. | 438/707 |
| 6,225,592 B1 | * | 5/2001 | Doughty | 219/121.43 |
| 6,270,862 B1 | * | 8/2001 | McMillin et al. | 427/569 |
| 6,433,297 B1 | * | 8/2002 | Kojima et al. | 219/121.43 |
| 6,706,334 B1 | * | 3/2004 | Kobayashi et al. | 427/534 |

* cited by examiner

Primary Examiner—Luz Alejandro-Mulero
(74) Attorney, Agent, or Firm—Rabin & Berdo, P.C.

(57) ABSTRACT

A microwave plasma processing apparatus is provided, which includes a microwave generator, a plasma promoter, a microwave plasma processing chamber, a vacuum gas-discharging chamber, and a loading elevator, wherein microwave produced from the microwave generator is gradually transformed into a desirable mode through the use of a microwave coupling resonator, and processing gas supplied by a gas supply system is evenly introduced via slantwise gas outlets of an annular gas distribution panel into the microwave processing chamber. The microwave is used to induce the processing gas to form a plasma sphere in the microwave plasma processing chamber; by reducing pressure in the microwave plasma processing chamber via the vacuum gas-discharging chamber, a vapor deposition process can be performed on a sample disposed on a sample holder of the loading elevator.

29 Claims, 4 Drawing Sheets

MICROWAVE PLASMA PROCESSING APPARATUS

FIELD OF THE INVENTION

The present invention relates to plasma processing apparatuses, and more particularly, to a microwave plasma processing apparatus for inducing plasma by microwave to form a plasma sphere under a controlled condition of pressure and gas flow, allowing a vapor deposition process to be implemented through the use of the plasma sphere.

BACKGROUND OF THE INVENTION

Microwave is a type of electromagnetic wave with a frequency generally between 0.3–30 GHz, and an industrial microwave dryer normally operates with microwave of a frequency of 915±25 MHz or 2450±50 MHz. Plasma is produced by breakdown of gas to form electrons and ions through an electric field, wherein the electrons are accelerated by an electromagnetic field such as microwave and collide with the gas to induce more production of ions and electrons, such that electrons and ions are continuously generated until equilibrium of such production and depletion is reached to thereby form stable plasma. Besides a few ions and electrons, plasma also contains highly reactive substances of an excited or transient state and free radicals, which can be used to perform particular reactions that are hardly implemented by basic-state substances.

Microwave plasma technology employs microwave energy to produce plasma, and can be applied to thin-film fabrication, nano-scale materials, wafer etching cleaning and burning of toxic waste gas. Microwave plasma is a plasma reaction system without requiring electrode and heat generator, whereby microwave is introduced as a primary energy source to a reaction chamber and induces gas molecules in the reaction chamber to decompose into atoms and then charged ions. However, in the use of microwave discharge to stimulate gas molecules, not all the gas molecules or atoms readily form ions by means of electron collision; in fact, most of the gas molecules are elevated to be in an unstable high-energy state by electrons, but quickly return to a stable low-energy state.

Microwave plasma is critically utilized for deposition of thin-film materials, fine processing and material surface modification. In terms of benefits such as high ion density and ionization, strong chemical reactivity, satisfactory process reproductivity, and low reaction temperature, microwave plasma is suitably applied to a plasma chemical gas thin-film deposition process and a plasma etching process under low temperature; this feature is important for fabrication of large-scale integrated circuits, microelectronic elements, photoelectric and communication integrated circuits, polymer materials, and thin-film sensors. Furthermore, in the use of a microwave plasma source of electron cyclotron resonance (ECR), gas molecules are accelerated to obtain high energy, and beam current density of an ion beam is increased, as well as processing area of the plasma source can be enlarged; in view thereof, development of microwave plasma advances application of ion source technology. In particular, the microwave plasma technique plays an important role in surface modification of large semiconductor elements, photoelectric materials and polymer materials; for example, a plasma etching process can be used to produce submicron-scale elements and large integrated circuits, plasma can be used to form thin diamond films, and so on.

Microwave can be transmitted in many ways, for example, via a coaxial cable, waveguide or dielectric, wherein the waveguide is required for high-energy microwave. Generally, a microwave device uses an electron tube named magnetron as a microwave source, allowing microwave of a particular oscillating mode to be transmitted via a waveguide, and introduced to a plasma chamber through quartz glass or dielectric windows, so as to collapse gas fed into the chamber for producing plasma by means of an electric field.

Microwave plasma is manipulated to allow microwave produced from the magnetron to pass through a circulator and enter into a plasma promoter, wherein circular metal tubes are connected to upper and lower sides of a square waveguide and each internally provided with a quartz tube; by reducing pressure in the quartz tube to approximately 0.1–1 torr via a vacuum pump, gas can easily ionize to form plasma by means of microwave power. However, the above arrangement would induce significant problems; cooling of the metal tubes by cool water is not effective due to considerably high temperature of plasma. Further, the produced plasma is of limited surface area in compliance with size of the waveguide, making this plasma only applicable to laboratory-scale usage. A solution is to enlarge portions of the square waveguide proximal to the circular metal tubes, in order to accommodate larger metal tubes and quartz tubes; nevertheless, certain limitation is expectably set on size enlargement.

The above small-area microwave plasma is not satisfactory according to industrial requirements; however, due to relatively short wavelength of microwave and complex interaction between microwave and plasma, it is therefore not easy to produce uniform plasma with large surface area. In response, a solution or breakthrough thereto is primarily based on an idea to make plasma in the form of a resonant chamber where microwave energy can be stored for inducing gas to generate plasma under a certain condition.

ECR microwave plasma operates to transfer energy of ionized electrons to atoms or molecules by means of elastic or non-elastic collision to induce a chain reaction for producing plasma. However, in a chamber with low pressure ($<10^{-2}$ torr), gas molecules are relatively fewer in quantity to rarely collide with electrons, thereby making it hard to form plasma. A solution is development of an ECR microwave plasma device; besides the use of microwave to stimulate gas molecules to ionize and generate plasma, a magnetic field is additionally provided in the chamber, and aligned vertically to an electric field in a manner as to allow electrons to be in a circular motion with a spiral moving path. When a moving angle frequency of electrons is equal to variation of microwave vector, a situation of ECR is reached, which elongates a moving path of electrons and thereby increases chance of collision between electrons and other gas molecules, so as to allow plasma to be formed and maintained under a low pressure condition. Generally, ECR operation pressure is around $10^{-4}$ to $10^{-3}$ torr; in such low pressure, impurities are less and contamination to raw materials is lower, and an average free diameter of gas molecules is larger, thereby making gas accelerate to obtain higher energy.

ECR is primarily applied to etching in the semiconductor industry, but limited in size corresponding to design of the resonant chamber. Moreover, as permittivity ($\epsilon r$) of plasma is between 1 and 2, when plasma is produced, a condition of a station wave generated in a plasma chamber would also change, such that several adjustments are required. For example, besides using a stub tuner to modulate impedance matching between microwave and plasma, intensity of a magnetic field and microwave output power can also be adjusted; nevertheless, it is still uneasy to form stable plasma as desired.

Particularly, when microwave penetrates through quartz windows and stimulates gas to produce plasma, since certain impedance exists between microwave and the whole mechanism prior to gas stimulation, this impedance would change in terms of many parameters by gas excitation, but can not be manipulated to form stable and uniform plasma. In addition, during coupling between microwave electric fields in the waveguide, microwave reflects to a great extent due to discontinuity of wave impedance for coaxial transmission of microwave directly, and when gas is introduced into a microwave plasma processing chamber, by discontinuity in dielectric coefficient of the device and environment, current accumulates and a plasma sphere can not be formed at a proper or desirable position. Furthermore, for suitably controlling pressure in the plasma processing chamber, an air-extracting system is used to reduce inner pressure of the chamber; however, this air-extracting system usually results in undesirable turbulence to gas provided by a gas supply system, thereby making plasma distribution uneven and degrading quality of fabrication process performances.

SUMMARY OF THE INVENTION

A primary objective of the present invention is to provide a microwave plasma processing apparatus, in which a microwave coupling resonator with a hollow spiral metal coupling antenna operates in a multiple-stage manner to gradually couple electric fields in a waveguide, so as to prevent microwave reflection due to discontinuity of wave impedance for coaxial transmission of microwave Another objective of the invention is to provide a microwave plasma processing apparatus, in which a plurality of slantwise outlets are disposed at equal intervals on an annular gas distribution panel, and evenly introduce processing gas to a microwave plasma processing chamber, so as to produce plasma uniformly distributed in processing area and prevent current accumulation due to discontinuity in dielectric constant of the apparatus and environment.

A further objective of the invention is to provide a microwave plasma processing apparatus, in which a metal ring with a slantwise inner wall is mounted over a sample holder to concentrate a plasma sphere formed thereon.

A further objective of the invention is to provide a microwave plasma processing apparatus, in which separately-designed vacuum chambers eliminate disturbance to gas supplied by a gas supply system through the use of an air-extracting system, thereby preventing uneven plasma distribution from occurrence.

A further objective of the invention is to provide a microwave plasma processing apparatus, in which a water circulating cooler is mounted at the end of a microwave coupling resonator to cool a terminal surface thereof, so as to prevent heat consumption caused by microwave reflection due to impedance mismatch.

In accordance with the above and other objectives, the present invention proposes a microwave plasma processing apparatus, comprising: a microwave generator for providing microwave and optimally adjusting microwave impedance to match between different loading terminals, a plasma promoter connected to the microwave generator, for inducing the microwave to be in a transverse magnetic (TM) mode; a microwave plasma processing chamber connected to the plasma promoter, for inducing processing gas in the microwave plasma processing chamber via the TM-mode microwave to form plasma for use in vapor deposition; a vacuum gas-discharging chamber disposed under the microwave plasma processing chamber, and connected via a chamber window to a pressure reducing device for reducing inner pressure of the microwave plasma processing chamber; and a loading elevator for positioning a sample to be processed in the microwave plasma processing chamber;

The microwave generator includes a magnetron oscillating to produce microwave of 2.45 GHz; a microwave one-way circulator for unidirectionally transmitting the microwave; a microwave direction-coupling device for measuring output and reflection power of the microwave; and a three-section regulator for optimally adjusting impedance of the microwave.

The plasma promoter includes a microwave coupling resonator structured with multiple sections for gradually transforming the microwave of a TE (transverse electrical) mode provided via a rectangular waveguide into a TEM (transverse electromagnetic) mode, so as to prevent microwave reflection due to discontinue microwave impedance from rectangular transmission to coaxial transmission of the microwave; and a microwave coupling resonant chamber for transforming the microwave from the TEM mode into the TM mode to eliminate the TE mode and a high-level mode undesirable for the microwave The microwave plasma processing chamber includes a gas distribution panel for evenly introducing the processing gas into the microwave plasma processing chamber via a plurality of slantwise gas outlets disposed on the gas distribution panel; and a sample holder for holding the sample. The microwave plasma processing chamber further includes a water cooling system for discharging heat generated by plasma production in the microwave plasma processing chamber.

The vacuum gas-discharging chamber and the microwave plasma processing chamber are separated by a metal block of a cylindrical shape, so as to prevent disturbance caused by an air-extracting system to the processing gas supplied by a gas supply system, which may lead to non-uniform plasmas distribution.

The loading elevator includes a central transmission shaft with one end thereof being connected to a sample holder where the sample is held, and an adjusting button for positioning the sample holder, so as to situate the sample in plasma forming area.

The microwave plasma processing apparatus according to the invention may process plasma vapor deposition on a sample, in which microwave is introduced into a cylindrical microwave coupling resonant chamber and excited into a TM mode in a manner of multiple-stage coaxial transformation. By separate vacuum arrangement of a microwave plasma processing chamber and a vacuum gas-discharging chamber connected to a vacuum gas-discharging system for reducing inner pressure thereof, mixed processing gas is transmitted from a gas supply system via the microwave to a gas distribution panel, and then uniformly enters into the microwave plasma processing chamber through slantwise gas outlets formed on the gas distribution panel, allowing molecules of the processing gas to ionize and form high density of ions. This high ionization makes plasma easily produced in processing area over the sample disposed on a sample holder and concentrate to be a plasma sphere that may be applied to a highly precise thin-film fabrication process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
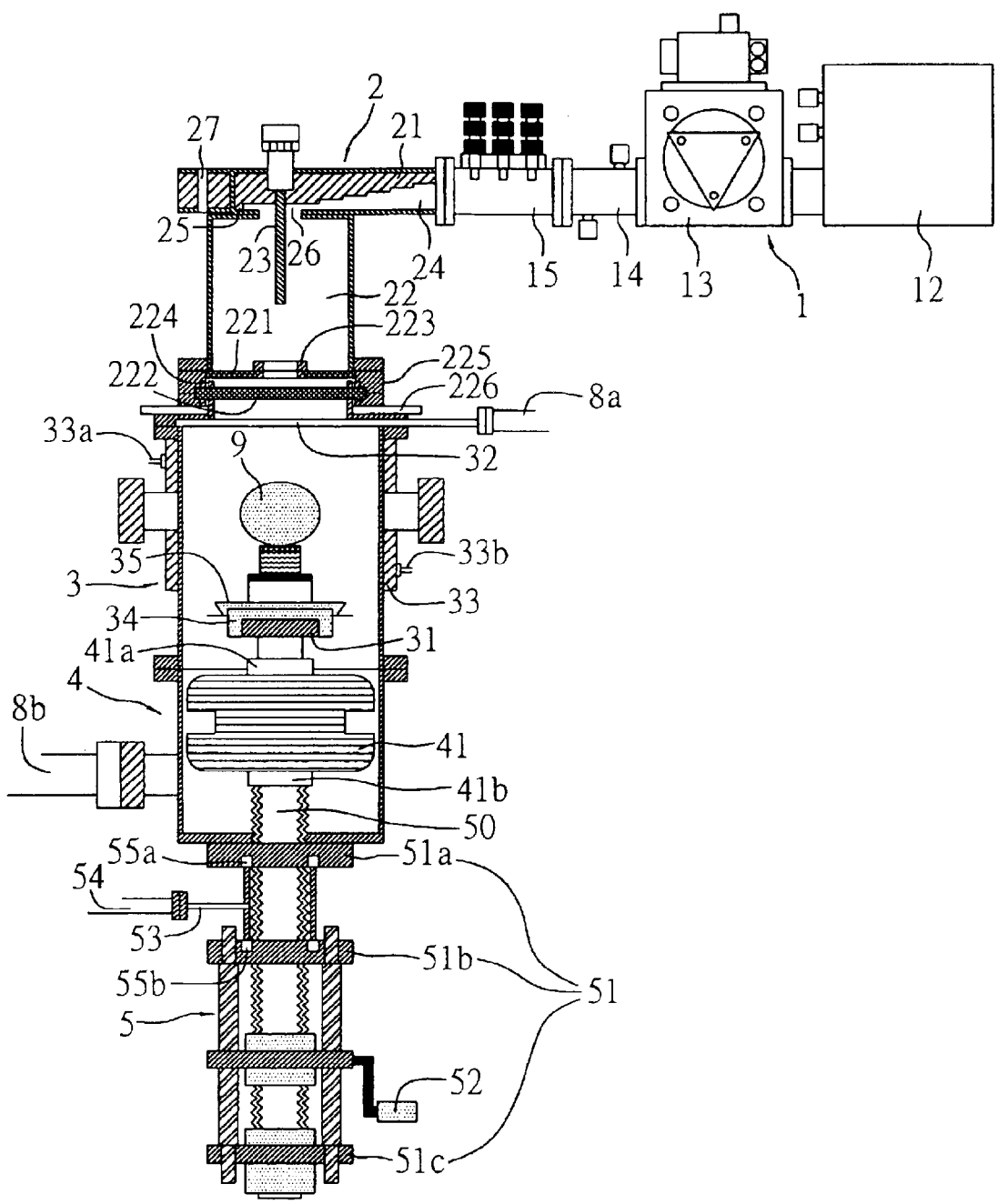
FIG. 1 is a cross-sectional view of a microwave plasma processing apparatus according to the invention.

FIG. 1 illustrates a microwave plasma processing apparatus proposed in the present invention, comprising: a microwave generator 1, a plasma promoter 2, a microwave plasma processing chamber 3, a vacuum gas-discharging chamber 4, and a loading elevator 5.

The microwave generator 1 is used to produce microwave and optimally adjust impedance to match between different loading terminals. In this embodiment, the microwave generator 1 includes a magnetron 12 oscillating to produce microwave of 2.45 GHz; a microwave one-way circulator 13 for unidirectionally transmitting microwave and preventing reverse transmission of microwave to damage a microwave source; a microwave direction-coupling device 14 for measuring output and reflection power of microwave; and a three-section regulator 15 for optimally adjusting impedance of the microwave source and system to match between different loading terminals.

Microwave processed by the three-section regulator 15 of the microwave generator 1 is transmitted to the plasma promoter 2 where the processed microwave is used to form plasma in the microwave plasma processing chamber 3; the plasma promoter 2 includes a microwave coupling resonator 21 and a microwave coupling resonant chamber 22.

Figure 2:
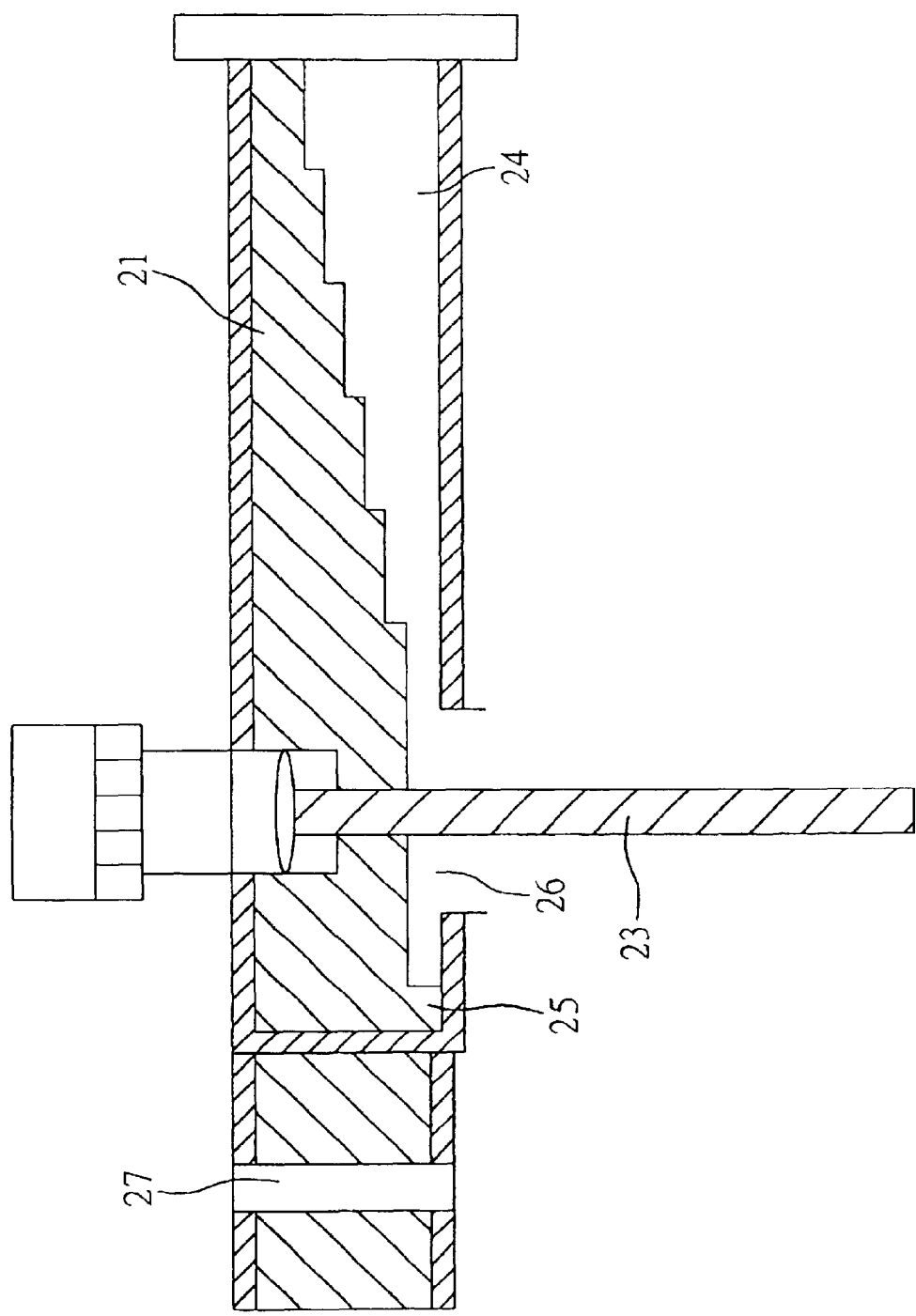
FIG. 2 is a schematic diagram of a microwave coupling resonator of the microwave plasma processing apparatus according to the invention.

As show in FIG. 2, the microwave coupling resonator 21 includes a rectangular waveguide 24 for transmitting microwave, a hollow spiral metal rod 23 serving as a microwave coupling antenna, and a microwave coupling opening 26. The microwave coupling resonator 21 operates in a multiple-stage manner to gradually alter an electric field of a TE10 (transverse electric) mode in the rectangular waveguide 24, and the hollow spiral metal rod 23 as a microwave coupling antenna forms a coaxial transmission line together with the microwave coupling opening 26 to gradually transform the TE10 mode in the rectangular waveguide 24 into a TEM (transverse electromagnetic) mode, so as to prevent microwave reflection due to discontinuity in wave impedance for coaxial transmission of microwave, and to excite a TM (transverse magnetic) mode in the microwave coupling resonant chamber 22 by means of the coupling antenna. Moreover, impedance of a microwave source and plasma can be modulated by adjusting length of the spiral-shaped coupling antenna inserted into the microwave coupling resonant chamber 22. In general, a terminal surface 25 of the microwave coupling resonator 21 is spaced apart from center of the coupling antenna by a distance of a multiple of $\lambda_g/4$ ($\lambda_g$=173.4 mm) in a manner as to assure the strongest intensity of microwave power at the center of the coupling antenna. Further, in consideration of heat consumption caused by microwave reflection due to impedance mismatch, a water circulating cooler 27 can be mounted at the end of the microwave coupling resonator 21 to cool the terminal surface 25 thereof.

The microwave coupling resonant chamber 22 of a hollow cylinder shape includes a metal ring 223 positioned by a quartz film 221, and a microwave-coupling dielectric quartz window 222. The metal ring 223 allows further selection of an electromagnetic field mode in the microwave coupling resonant chamber 22 to be a desirable TM resonant mode and to eliminate an undesirable TE or high-level mode, as well as to concentrate field intensity of the electromagnetic field in the microwave coupling resonant chamber 22; this makes a plasma sphere easily formed in the microwave plasma processing chamber 3. The microwave-coupling dielectric quartz window 222 is internally mounted to bottom of the microwave coupling resonant chamber 22, for separating a microwave source and plasma generating area, to thereby avoid shielding formed by the generated plasma against introduction of microwave into the microwave plasma processing chamber 3, which may reduce introduction rate of microwave and lead to significant microwave reflection. Moreover, the microwave coupling resonant chamber 22 is sealed in a vacuum with the microwave-coupling dielectric quartz window 222 by a heat-resistant O-ring 224, and is cooled by an annular water circulating cooler 226 disposed below the O-ring 224. In addition, gas can be filled into the hollow coupling antenna of the microwave coupling resonator 21 to enter the microwave coupling resonant chamber 22 where an annular outlet thereof is used to dissipate heat and cool the microwave coupling hole 26 and the microwave coupling resonant chamber 22.

Figure 3A:
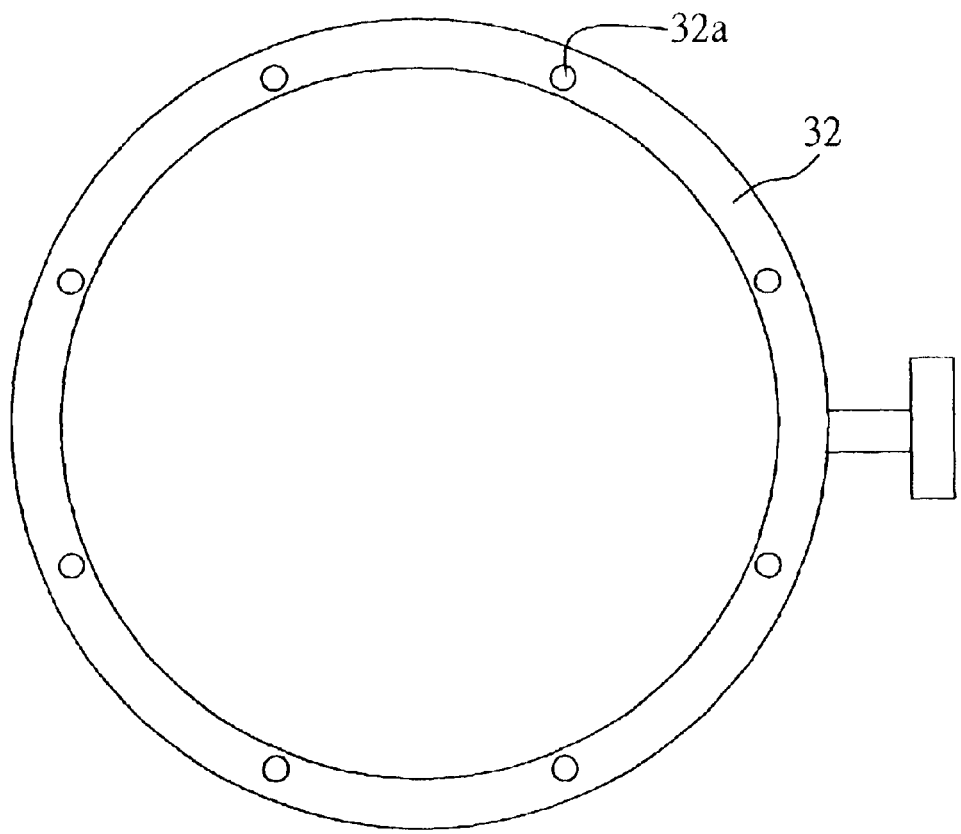
FIG. 3(a) is a top view of a gas distribution panel of the microwave plasma processing apparatus according to the invention.
Figure 3B:
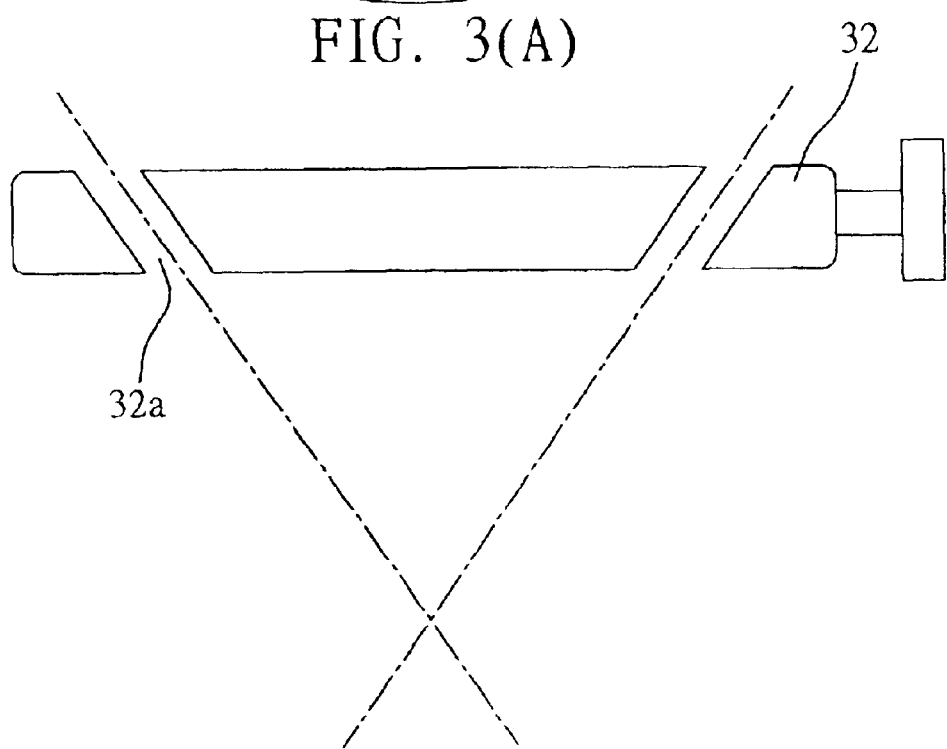
FIG. 3(b) is a cross-sectional view of the gas distribution panel shown in FIG. 3(a)
Figure 4:
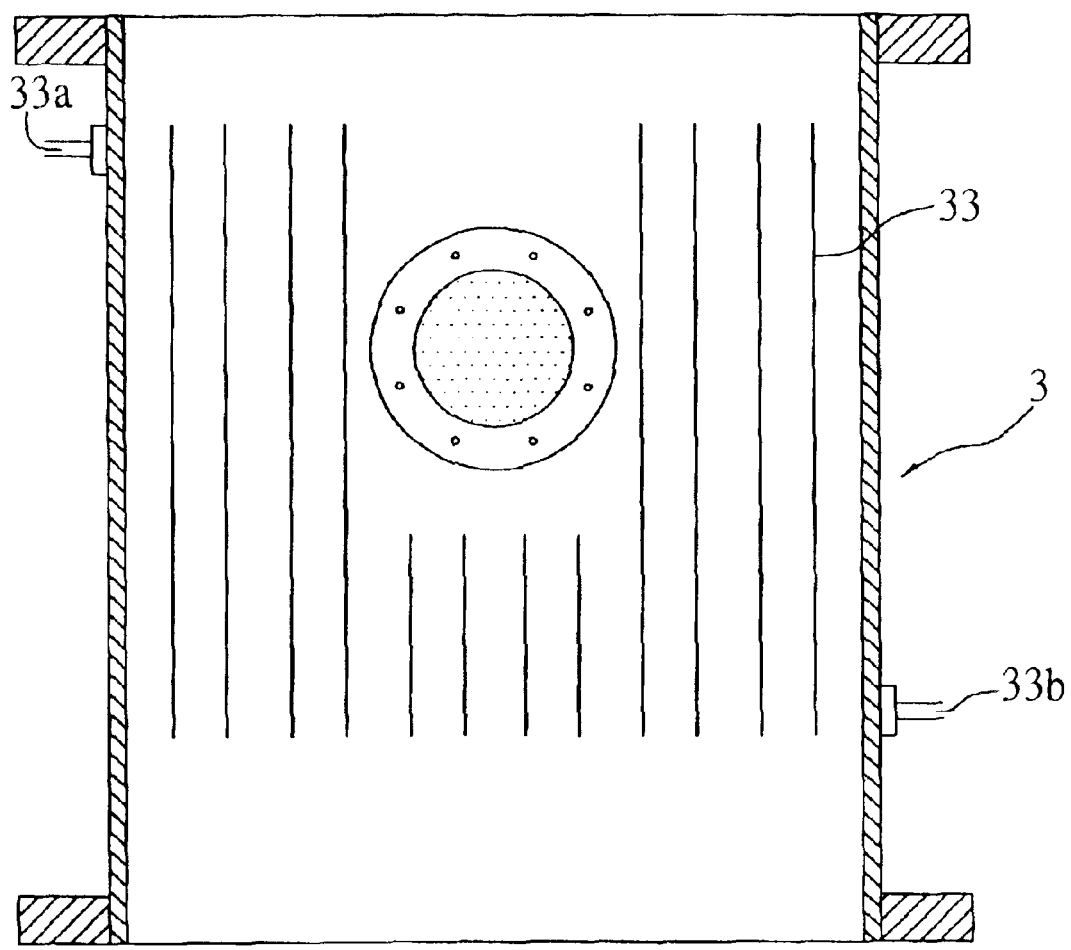
FIG. 4 is a schematic diagram of a cooling system mounted externally to a microwave plasma processing chamber of the microwave plasma processing apparatus according to the invention.

By a single TM01 mode in the microwave coupling resonant chamber 22, a magnetic field of the microwave plasma processing chamber 3 can be arranged in an annular manner, and an electric field thereof is arranged in a radial direction and along a direction toward the chamber center, with the centrally-directed electric field having the strongest intensity to comply with the requirement of centrally concentrated microwave power density. By providing appropriate control of the chamber pressure and gas flow, the TM01 mode may induce plasma to form a plasma sphere 9 that can be used in a vapor deposition process. The microwave plasma processing chamber 3 includes a gas distribution panel 32 and a sample holder 31. As shown in FIGS. 3 (a) and 3 (b), the gas distribution panel 32 is of an annular shape, and formed with a plurality of equally-distributed gas outlets 32a at a periphery thereof. Each of the gas outlet 32a is dimensioned in diameter according to a flow rate of processing gas, and slantwise-shaped by an angle in correspondence to an internal diameter of the microwave plasma processing chamber 3. The gas distribution panel 32 may be mounted atop the microwave plasma processing chamber 3, allowing mixed processing gas to be provided from an gas supply system 8a through a flow controller (not shown) to the gas distribution panel 32, and then, the processing gas is uniformly supplied via the slantwise gas outlets 32a of the gas distribution panel 32 into the microwave plasma processing chamber 3, such that plasma may be easily formed in processing area over a sample held on the sample holder 31, thereby preventing current accumulation due to discontinuity in dielectric constant of the microwave-coupling dielectric quartz window 222 and environment. Moreover, the gas distribution panel 32 may also be mounted over the sample holder 31, which thereby keeps inlet of the processing gas away from the microwave-coupling dielectric quartz window 222, wherein the plurality of gas outlets 32a formed on the gas distribution panel 32 are slantwise toward the plasma processing area, to thereby allow plasma to be desirably produced on the processing area. The sample holder 31 is used for holding a sample to be processed, and a metal cover 34 is mounted on the sample holder 31 and formed with a metal ring 35 whose inner wall is gradient by 45 degrees to help concentrate a plasma sphere. As shown in FIG. 4, a water cooling system 33 is externally connected to and encompasses the microwave plasma processing chamber 3, wherein circulating cold water enters via an inlet canal 33a and circulating hot water flows out through an outlet canal 33b to take away heat generated by plasma production in the microwave plasma processing chamber 3.

The vacuum gas-discharging chamber 4 is disposed under the microwave plasma processing chamber 3, and separated from the microwave plasma processing chamber 3 by a metal block 41; this separate arrangement is purposed to prevent disturbance generated by an air-extracting system 8b to gas supplied from the air supply system 8a, which may lead to non-uniform plasma distribution. The metal block 41 is held concentrically with the loading elevator 5, and positioned by means of metal sleeves 41a, 41b disposed at upper and lower ends of the metal block 41. The metal block 41 can be flexibly positioned in the vacuum gas-discharging chamber 4 to modulate a coupling resonance condition for the microwave coupling resonant chamber 22, as a reference to positioning of the plasma sphere 9. The vacuum gas-discharging chamber 4 is connected to a vacuum gas-discharging system 54 via a chamber window 53, for reducing inner pressure of the microwave plasma processing chamber 3.

The loading elevator 5 includes a central transmission shaft 50 disposed on a fixing base 51, and is used to adjust a position of the sample holder 31 above the central transmission shaft 50 via an adjusting button 52, so as to situate the sample held on the sample holder 31 in the processing area. The fixing base 51 is composed of an upper fixing base 51a, a middle fixing base 51b and a lower fixing base 51c, wherein the upper fixing base 51a is connected to the vacuum gas-discharging chamber 4. Inner walls of the upper fixing base 51a and middle fixing base 51b are embedded with O-rings 55a, 55b respectively to seal up a corresponding portion of the fixing base 51 in a vacuum. A chamber window 53 disposed between the upper fixing base 51a and middle fixing base 51b is connected to the vacuum gas-discharging system 54 to form a vacuum, so as to allow the central transmission shaft 50 to move in a vacuum for positioning the sample holder 31 in the microwave plasma processing chamber 3.

The microwave plasma processing apparatus according to the invention may process plasma vapor deposition on a sample, in which microwave is introduced into a cylindrical microwave coupling resonant chamber and excited into a TM01 mode in a manner of multiple-stage coaxial transformation. By separate vacuum arrangement of a microwave plasma processing chamber and a vacuum gas-discharging chamber connected to a vacuum gas-discharging system for reducing inner pressure thereof, mixed processing gas is transmitted from a gas supply system via the microwave to a gas distribution panel, and then uniformly enters into the microwave plasma processing chamber through slantwise gas outlets formed on the gas distribution panel, allowing molecules of the processing gas to ionize and form high density of ions. This high ionization makes plasma easily produced in processing area over the sample disposed on a sample holder and concentrate to be a plasma sphere that may be applied to a highly precise thin-film fabrication process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A microwave plasma processing apparatus, comprising:
   a microwave generator for providing microwave and optimally adjusting microwave impedance to match between different loading terminals;
   a plasma promoter connected to the microwave generator, for inducing the microwave to be in a transverse magnetic (TM) mode;
   a microwave plasma processing chamber connected to the plasma promoter, for inducing processing gas in the microwave plasma processing chamber via the TM-mode microwave to form plasma for use in vapor deposition;
   a vacuum gas-discharging chamber disposed under the microwave plasma processing chamber, and connected via a chamber window to a pressure reducing device for reducing inner pressure of the microwave plasma processing chamber; and
   a loading elevator for positioning a sample to be processed in the microwave plasma processing chamber;
   wherein the plasma promoter comprises:
   a microwave coupling resonator structured with multiple sections for gradually transforming the microwave of a TE (transverse electrical) mode provided via a rectangular waveguide into a TEM (transverse electromagnetic) mode, so as to prevent microwave reflection due to discontinue microwave impedance from rectangular transmission to coaxial transmission of the microwave; and
   a microwave coupling resonant chamber for transforming the microwave from the TEM mode into the TM mode to eliminate the TE mode and a high-level mode undesirable for the microwave.

2. The microwave plasma processing apparatus of claim 1, wherein the microwave generator comprises a magnetron oscillating to produce microwave of 2.45 GHz; a microwave one-way circulator for unidirectionally transmitting the microwave; a microwave direction-coupling device for measuring output and reflection power of the microwave; and a three-section regulator for optimally adjusting impedance of the microwave.

3. The microwave plasma processing apparatus of claim 1, wherein the microwave coupling resonator comprises a metal rod as a microwave coupling antenna that forms a coaxial transmission line together with a microwave coupling opening to transform the TE mode into the TEM mode and to excite the TM mode of microwave in the microwave coupling resonant chamber.

4. The microwave plasma processing apparatus of claim 3, wherein the coupling antenna is hollow, allowing gas to be filled through a top end of the coupling antenna into the microwave coupling resonant chamber and expelled via an annular outlet of the microwave coupling resonant chamber for heat dissipation.

5. The microwave plasma processing apparatus of claim 3, wherein the coupling antenna is of a spiral shape, allowing length of the coupling antenna inserted into the microwave coupling resonant chamber to be adjusted for matching impedance between the microwave and plasma.

6. The microwave plasma processing apparatus of claim 3, wherein a terminal surface of the microwave coupling resonator is spaced apart from the center of the coupling antenna by a distance of a multiple of $\lambda g/4$ ($\lambda g=173.4$ mm), to assure the strongest power intensity of the microwave at the center of the coupling antenna.

7. The microwave plasma processing apparatus of claim 1, wherein a circulating water cooler is mounted at an end of the microwave coupling resonator to cool a terminal surface of the end of the microwave coupling resonator.

8. The microwave plasma processing apparatus of claim 1, wherein the microwave coupling resonant chamber includes a metal ring positioned by a quartz film, the metal ring allowing further mode selection of an electromagnetic field in the microwave coupling resonant chamber and concentrating the electromagnetic field.

9. The microwave plasma processing apparatus of claim 1, wherein the microwave coupling resonant chamber includes a microwave-coupling dielectric quartz window for separating a microwave source and plasma forming area.

10. The microwave plasma processing apparatus of claim 1, wherein the vacuum gas-discharging chamber and the microwave plasma processing chamber are separated by a metal block of a cylindrical shape.

11. The microwave plasma processing apparatus of claim 1, wherein a water cooling system is externally mounted to the microwave plasma processing chamber, for dissipating heat generated by plasma production in the microwave plasma processing chamber.

12. The microwave plasma processing apparatus of claim 1, wherein the pressure reducing device is a vacuum gas-discharging system.

13. The microwave plasma processing apparatus of claim 1, wherein the loading elevator includes a central transmission shaft with one end thereof being connected to a sample holder where the sample is held, and an adjusting button for positioning the sample holder.

14. A microwave plasma processing apparatus, comprising:
   a microwave generator for providing microwave and optimally adjusting microwave impedance to match between different loading terminals;
   a plasma promoter connected to the microwave generator, wherein the plasma promoter comprises a microwave coupling resonator structured with multiple sections for gradually transforming the microwave of a TE (transverse electrical) mode provided via a rectangular waveguide into a TEM (transverse ectromagnetic) mode, and a microwave coupling resonant chamber for transforming the microwave from the TEM mode into a TM mode to eliminate the TE mode and a high-level mode undesired for the microwave;
   a microwave plasma processing chamber connected to the plasma promoter, for inducing processing gas in the microwave plasma processing chamber via the TM-mode microwave to form plasma for use in vapor deposition;
   a vacuum gas-discharging chamber disposed under the microwave plasma processing chamber, and connected via a chamber window to a pressure reducing device for reducing inner pressure of the microwave plasma processing chamber; and a loading elevator for positioning a sample to be processed in the microwave plasma processing chamber; wherein the microwave plasma processing chamber comprises:
   a gas distribution panel for evenly introducing the processing gas into the microwave plasma processing chamber via a plurality of slantwise gas outlets disposed on the gas distribution panel; and
   a sample holder for holding the sample.

15. The microwave plasma processing apparatus of claim 14, wherein the gas distribution panel is of an annular shape and mounted on a top end of the microwave plasma processing chamber.

16. The microwave plasma processing apparatus of claim 14, wherein the gas distribution panel is of an annular shape and mounted over the sample holder.

17. The microwave plasma processing apparatus of claim 14, wherein the gas outlets are each slanted by an angle according to an inner diameter of the microwave plasma processing chamber.

18. The microwave plasma processing apparatus of claim 14, wherein the gas outlets are dimensioned in diameter corresponding to a flow rate of the processing gas.

19. The microwave plasma processing apparatus of claim 14, wherein the microwave generator comprises a magnetron oscillating to produce microwave of 2.45 GHz; a microwave one-way circulator for unidirectionally transmitting the microwave; a microwave direction-coupling device for measuring output and reflection power of the microwave; and a three-section regulator for optimally adjusting impedance of the microwave.

20. The microwave plasma processing apparatus of claim 14, wherein the vacuum gas-discharging chamber and the microwave plasma processing chamber are separated by a metal block of a cylindrical shape.

21. The microwave plasma processing apparatus of claim 14, wherein a water cooling system is externally mounted to the microwave plasma processing chamber, for dissipating heat generated by plasma production in the microwave plasma processing chamber.

22. The microwave plasma processing apparatus of claim 14, wherein the pressure reducing device is a vacuum gas-discharging system.

23. The microwave plasma processing apparatus of claim 14, wherein the loading elevator includes a central transmission shaft with one end thereof being connected to the sample holder where the sample is held, and an adjusting button for positioning the sample holder.

24. A microwave plasma processing apparatus, comprising: a microwave generator for providing microwave and optimally adjusting microwave impedance to match between different loading terminals;
   a plasma promoter connected to the microwave generator, wherein the plasma promoter comprises a microwave coupling resonator structured with multiple sections for gradually transforming the microwave of a TE (transverse electrical) mode provided via a rectangular waveguide into a TEM (transverse electromagnetic) mode, and a microwave coupling resonant chamber for transforming the microwave from the TEM mode into a TM mode to eliminate the TE mode and a high-level mode undesired for the microwave:
   a microwave plasma processing chamber connected to the plasma promoter, for inducing processing gas in the microwave plasma processing chamber via the TM-mode microwave to form plasma for use in vapor deposition;
   a vacuum gas-discharging chamber disposed under the microwave plasma processing chamber, and connected via a chamber window to a pressure reducing device for reducing inner pressure of the microwave plasma processing chamber, and a loading elevator for positioning a sample holder that holds a sample to be processed in the microwave plasma processing chamber;

wherein the sample holder is provided with a metal ring with an inner wall thereof being slanted by 45 degrees for concentrating the plasma formed thereon.

25. The microwave plasma processing apparatus of claim 24, wherein the microwave generator comprises a magnetron oscillating to produce microwave of 2.45 GHz; a microwave one-way circulator for unidirectionally transmitting the microwave; a microwave direction-coupling device for measuring output and reflection power of the microwave; and a three-section regulator for optimally adjusting impedance of the microwave.

26. The microwave plasma processing apparatus of claim 24, wherein the vacuum gas-discharging chamber and the microwave plasma processing chamber are separated by a metal block of a cylindrical shape.

27. The microwave plasma processing apparatus of claim 24, wherein a water cooling system is externally mounted to the microwave plasma processing chamber, for dissipating heat generated by plasma production in the microwave plasma processing chamber.

28. The microwave plasma processing apparatus of claim 24, wherein the pressure reducing device is a vacuum gas-discharging system.

29. The microwave plasma processing apparatus of claim 24, wherein the loading elevator includes a central transmission shaft with one end thereof being connected to the sample holder where the sample is held, and an adjusting button for positioning the sample holder.

* * * * *